US010068748B2

(12) United States Patent
Uziel et al.

(10) Patent No.: US 10,068,748 B2
(45) Date of Patent: Sep. 4, 2018

(54) SCANNING AN OBJECT USING MULTIPLE MECHANICAL STAGES

(71) Applicant: APPLIED MATERIALS ISRAEL LTD., Rehovot (IL)

(72) Inventors: Yoram Uziel, Misgav (IL); Benzion Sender, Modiin-Macabim-Reut (IL); Doron Aspir, Modiin-Macabim-Reut (IL); Yohanan Madmon, Kiryat Eqron (IL); Ron Naftali, Shoham (IL); Yuri Belenky, Rishon Lezion (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 15/371,332

(22) Filed: Dec. 7, 2016

(65) Prior Publication Data
US 2017/0084425 A1   Mar. 23, 2017

Related U.S. Application Data

(63) Continuation of application No. PCT/US2015/034848, filed on Jun. 9, 2015.
(Continued)

(51) Int. Cl.
*H01J 37/28* (2006.01)
*H01J 37/20* (2006.01)
*G06T 7/00* (2017.01)

(52) U.S. Cl.
CPC ............ *H01J 37/28* (2013.01); *G06T 7/0004* (2013.01); *H01J 37/20* (2013.01);
(Continued)

(58) Field of Classification Search
CPC ............ G03F 7/70716; G03F 7/70725; G03F 7/70758; G03F 7/70775; G03F 7/70825;
(Continued)

(56) References Cited

U.S. PATENT DOCUMENTS 3,419,238 A * 12/1968 Flory .................. F16M 11/045
                                                       108/136
4,667,415 A * 5/1987 Barsky .................... B23Q 1/36
                                                        269/73

(Continued)

FOREIGN PATENT DOCUMENTS

KR    1020110119079 A    11/2011
WO       2015191543 A1    12/2015

OTHER PUBLICATIONS

PCT/US2015/034848, "International Search Report and Written Opinion", dated Sep. 18, 2015, 12 pages.

*Primary Examiner* — David A Vanore
(74) *Attorney, Agent, or Firm* — Kilpatrick Townsend & Stockton LLP

(57) ABSTRACT

A method for scanning an object, the method may include moving an object by a first mechanical stage that follows a first scan pattern; introducing multiple movements, by a second mechanical stage, between the object and the first mechanical stage while the first mechanical stage follows the first scan pattern; and obtaining, by optics, images of multiple suspected defects while the first mechanical stage follows the first scan pattern; wherein a weight of the first mechanical stage exceeds a weight of the second mechanical stage.

20 Claims, 10 Drawing Sheets

Related U.S. Application Data

(60) Provisional application No. 62/010,211, filed on Jun. 10, 2014.

(52) U.S. Cl.
CPC .............. *G06T 2207/30148* (2013.01); *H01J 2237/20228* (2013.01); *H01J 2237/2817* (2013.01)

(58) Field of Classification Search
CPC ....... H01J 37/20; H01J 37/265; H01L 21/682; F16M 11/045; F16M 11/048; F16M 11/046; F16M 11/2085; F16M 11/2092
USPC ........ 250/307, 310, 311, 306, 492.2, 441.11, 250/442.11; 248/163.1, 591; 318/560, 318/568.17, 574, 649, 671; 356/500
See application file for complete search history.

(56) References Cited

U.S. PATENT DOCUMENTS

| | | | |
|---|---|---|---|
| 4,694,477 A * | 9/1987 | Siddall | G03F 7/70716 250/492.2 |
| 5,901,936 A * | 5/1999 | Bieg | B23Q 1/5462 248/163.2 |
| 6,402,329 B1 * | 6/2002 | Bailly | G02B 7/1822 248/476 |
| 6,484,602 B1 | 11/2002 | Amatucci et al. | |
| 6,688,183 B2 * | 2/2004 | Awtar | G01M 5/005 73/782 |
| 6,750,625 B2 * | 6/2004 | Binnard | G03F 7/70716 318/568.17 |
| 7,348,709 B2 | 3/2008 | Xu et al. | |
| RE41,232 E | 4/2010 | Hazelton et al. | |
| 8,072,120 B2 * | 12/2011 | Awtar | G05G 5/03 310/328 |
| 8,207,499 B2 * | 6/2012 | Shoham | G01N 23/2208 250/306 |
| 8,330,329 B2 | 12/2012 | Suzuki et al. | |
| 8,390,233 B2 * | 3/2013 | Shilpiekandula | B82Y 10/00 318/135 |
| 9,466,462 B2 * | 10/2016 | Sender | H01J 37/265 |
| 9,666,412 B1 * | 5/2017 | Litman | H01J 37/20 |
| 2001/0012449 A1 | 8/2001 | Kawabe et al. | |
| 2004/0037626 A1 | 2/2004 | Awtar et al. | |
| 2009/0153824 A1 * | 6/2009 | Balan | G03B 27/42 355/67 |
| 2011/0278452 A1 * | 11/2011 | Nozoe | H01J 37/244 250/307 |
| 2013/0207328 A1 | 8/2013 | Awtar et al. | |
| 2013/0293865 A1 * | 11/2013 | Ummethala | H01J 37/20 355/75 |
| 2013/0342827 A1 * | 12/2013 | Ummethala | G01B 11/14 356/72 |

* cited by examiner

SCANNING AN OBJECT USING MULTIPLE MECHANICAL STAGES

CROSS-REFERENCES TO RELATED APPLICATIONS

This application is a continuation of and claims priority to PCT/US2015/034848, filed Jun. 9, 2015; which claims the benefit of U.S. Provisional Application No. 62/010,211, filed on Jun. 10, 2014. The disclosures of each of PCT/US2015/034848 and U.S. Provisional Application No. 62/010,211 are hereby incorporated by reference in their entirety for all purposes.

BACKGROUND OF THE INVENTION

Wafers, such as those used in the manufacture of integrated circuits and similar technologies, are manufactured by highly complicated manufacturing processes. These manufacturing processes should be monitored in order to ensure the quality of the wafers.

The monitoring process may include a first phase of optical inspection, ultraviolet inspection, deep ultraviolet inspection or extreme ultraviolet inspection to detect potential defects and a second phase of defect review.

Defect review is usually executed by a scanning electron microscope that exhibits very high resolution (nanometric order) but is very slow.

A wafer is supported by a heavy mechanical stage. The heavy mechanical stage can weigh few hundred kilograms.

For each suspected defect the defect review process includes (a) mechanically moving the wafer (by the heavy mechanical stage) until the scanning electron microscope can view a suspected defect, (b) stopping the movement of the heavy mechanical stage, and (c) scanning the suspected defect while the wafer is stationary.

FIG. 1 illustrates wafer 10. Wafer 10 includes various suspected defects (denoted "o" 20, 201, 202 and 203). FIG. 1 also illustrates (dashed lines 30, 301, 302, 303) a scan pattern that is followed by the heavy mechanical stage. The heavy mechanical stage accelerated towards a suspected defect, decelerates until being stationary when reaching the vicinity of the suspected defect, and then waiting until the optics obtains an image of the suspected defect.

A review of about 100000 suspected defects of a 300 mm wafer can take a day—mostly because of the time required to accelerate the heavy mechanical stage and to decelerate the heavy mechanical stage until the heavy mechanical stage is stationary.

There is a growing need to accelerate the defect review process of suspected defects.

BRIEF SUMMARY OF THE INVENTION

According to an embodiment of the invention there may be provided a system that may include a first mechanical stage, a second mechanical stage and optics. The first mechanical stage is configured to move an object by following a first scan pattern. The second mechanical stage is configured to introduce multiple movements between the object and the first mechanical stage while the first mechanical stage follows the first scan pattern. The optics is configured to obtain images of multiple suspected defects while the first mechanical stage follows the first scan pattern. The weight of the first mechanical stage exceeds a weight of the second mechanical stage.

The first mechanical stage may be configured to move the object within a first plane that is not orthogonal to a direction of the movement introduced by the second mechanical stage.

According to an embodiment of the invention there may be provided a method for moving an object. The method may include (a) moving an object by a first mechanical stage that follows a first scan pattern; (b) introducing multiple movements, by a second mechanical stage, between the object and the first mechanical stage while the first mechanical stage follows the first scan pattern; and (c) obtaining, by optics, images of multiple suspected defects while the first mechanical stage follows the first scan pattern. A weight of the first mechanical stage exceeds a weight of the second mechanical stage.

The moving of the object by the first mechanical stage may cause the object to move within a first plane that is not orthogonal to a direction of the movement introduced by the second mechanical stage.

The moving of the object by the first mechanical stage may include performing, by the first mechanical stage, movements along multiple scan lines. The obtaining of the images of the multiple suspected defects may be performed without altering a velocity of each one of the movements along the multiple scan lines.

The moving of the object by the first mechanical stage may include performing, by the first mechanical stage, movements along multiple scan lines. The obtaining of the images the multiple suspected defects may be performed during the performing of the movements along the multiple scan lines. A highest acceleration introduced by the first mechanical stage during any of the movements along the multiple scan lines may be lower than a highest acceleration introduced by the second mechanical stage during any of the multiple movements between the object and the first mechanical stage.

The moving of the object by the first mechanical stage may include performing, by the first mechanical stage, constant velocity movements along multiple scan lines. The obtaining of the images the multiple suspected defects may be performed without altering a velocity of each one of the constant velocity movements.

The method may include introducing a movement out of the multiple movements by the second mechanical stage so that a field of view of the optics moves towards a suspected defect if it is determined that the suspected defect is outside a field of view of the optics in case that the object is moved only by the first mechanical stage that follows the first scan pattern.

The method may include refraining from introducing a movement, by the second mechanical stage, so that a field of view of the optics moves towards a suspected defect if it is determined that the suspected defect is within a field of view of the optics in case that the object is moved only by the first mechanical stage that follows the first scan pattern.

The moving of the object by the first mechanical stage may include performing, by the first mechanical stage, movements along multiple scan lines; and introducing a counter movement by the second mechanical stage, while the mechanical stage performs a movement along a scan line thereby increasing a period in which a suspected defect is within a field of view of the optics.

The method may include determining the first scan pattern in view of locations of the multiple suspected defects.

The method may include determining the first scan pattern and a second scan pattern in view of (a) locations of the multiple suspected defects, and (b) allowable acceleration values associated with the first scan pattern and the second scan pattern. The second scan pattern may be formed by the multiple movements introduced by the second mechanical stage.

The method may include determining a second scan pattern in view of (a) an image obtaining period required for acquiring one or more images of a suspected defect, (b) a desired velocity of a movement of the first mechanical stage when scanning a scan line of the first scan pattern; and (c) a time period required for the second mechanical stage to position a suspected defect within a field of view of the optics.

The method may include determining a second scan pattern in view of (a) an image obtaining period required for acquiring one or more images of a suspected defect, (b) a desired velocity of a movement of the first mechanical stage when scanning a scan line of the first scan pattern; (c) a time period required for the second mechanical stage to position a suspected defect within a field of view of the optics. The second scan pattern may be formed by the multiple movements introduced by the second mechanical stage.

The method may include determining the first scan pattern and a second scan pattern in view of (a) an image obtaining period required for acquiring one or more images of a suspected defect, (b) a desired velocity of a movement of the first mechanical stage when scanning a scan line of the first scan pattern; (c) a time period required for the second mechanical stage to position a suspected defect within a field of view of the optics. The second scan pattern may be formed by the multiple movements introduced by the second mechanical stage.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
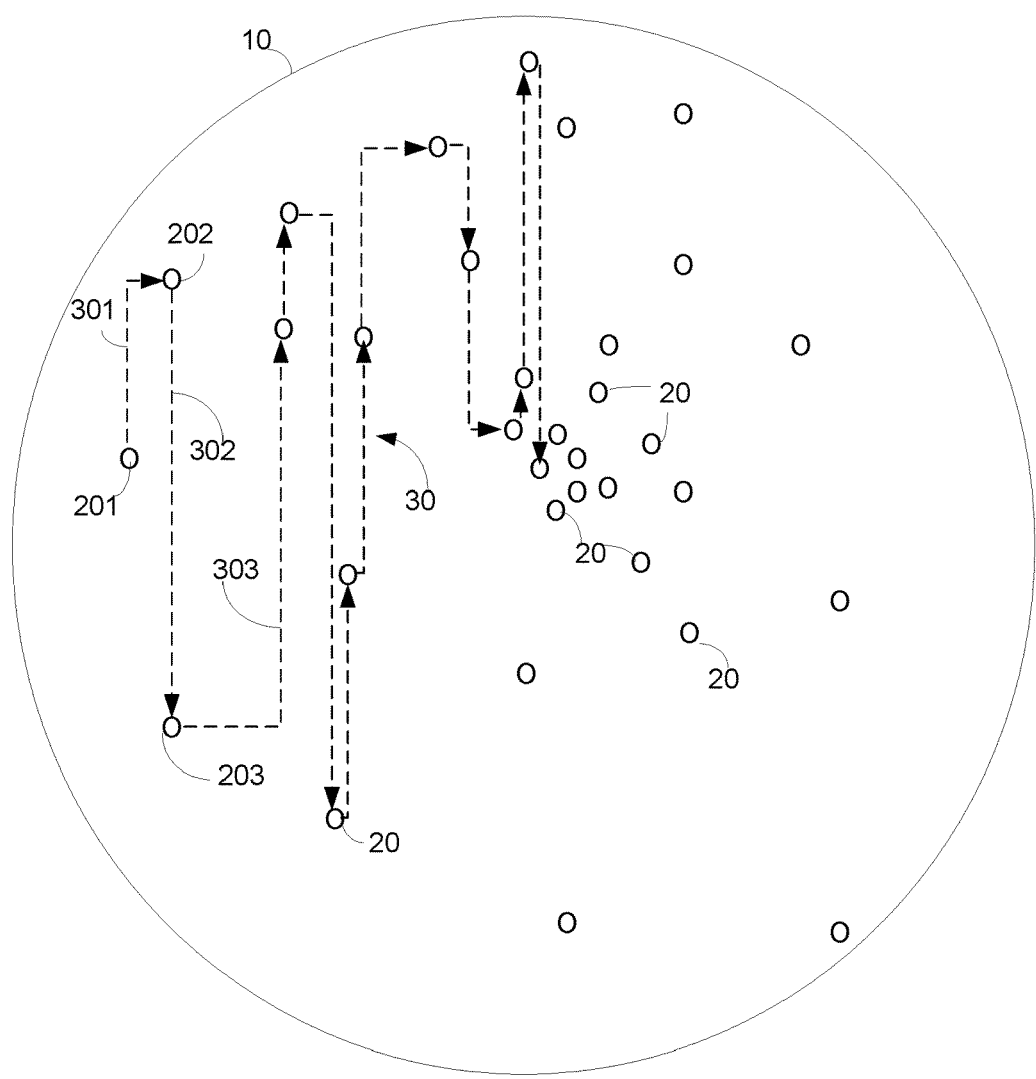
FIG. 1 illustrates a prior art wafer and a prior art scan pattern.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

According to an embodiment of the invention there is provided a method and a system for defect review, and especially a high speed method and system for defect review.

An object (such as but not limited to a wafer, a mask, a solar panel, a micro-machined substrate and the like) is moved by using a first mechanical stage and a second mechanical stage.

The first mechanical stage is heavier than the second mechanical stage. The weight of the first mechanical stage can exceed the weight of the second mechanical stage by a weight factor that may exceed 2. The weight factor may be a positive integer or any other positive number.

The first mechanical stage follows a first scan pattern (for example a raster scan pattern or any other scan pattern). The first scan pattern may include multiple scan lines and non-scan lines for moving the first mechanical stage from one scan line to another.

The non-scan lines may be orthogonal to the scan lines.

Figure 2:
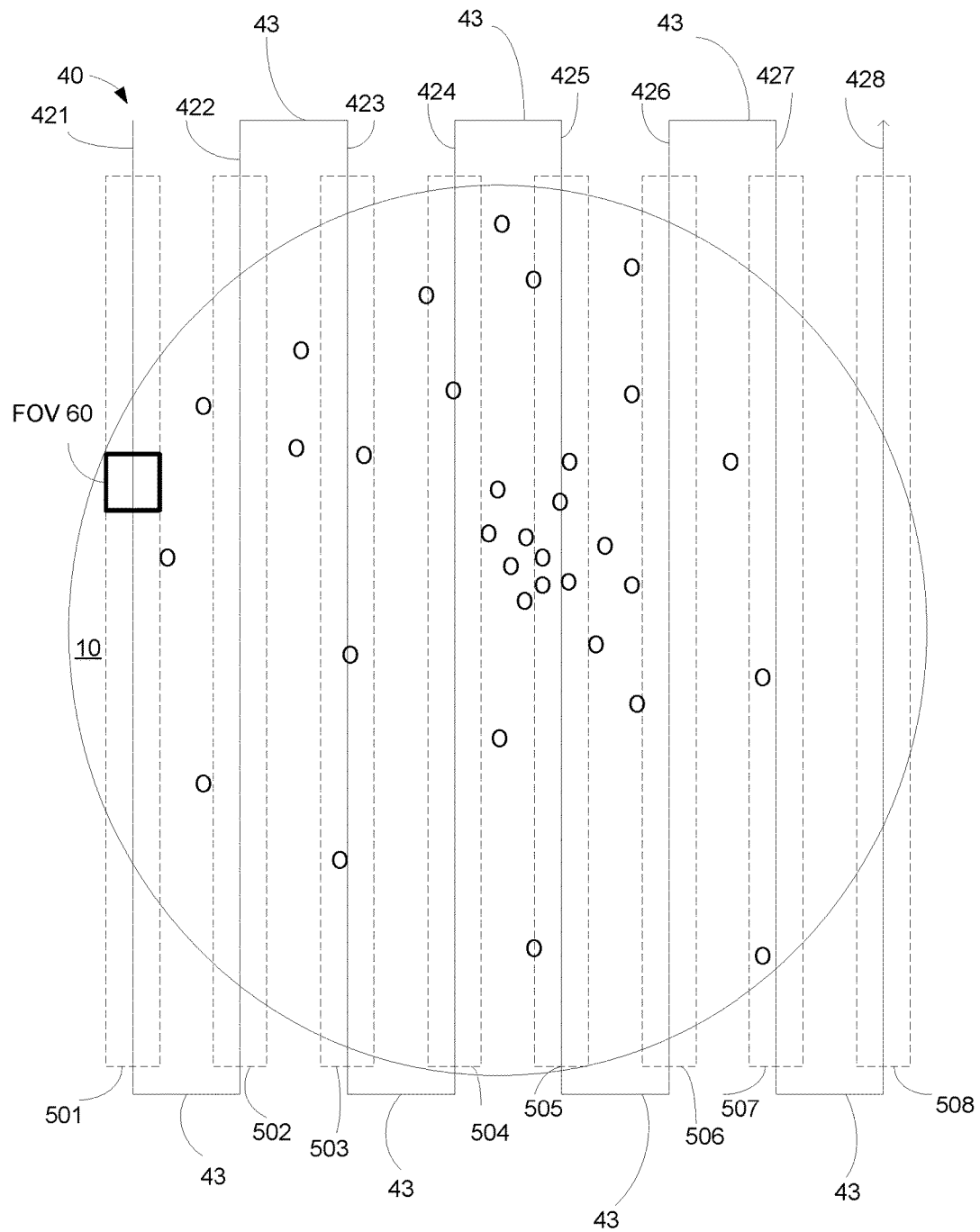
FIG. 2 illustrates a wafer, multiple suspected defects, a field of view, a first scan pattern and areas of the wafer viewed by optics when an object is moved solely by a first mechanical stage, according to an embodiment of the invention.

Referring to FIG. 2, the first scan pattern 40 includes vertical scan lines 421-428 and horizontal non-scan lines 43.

The first mechanical stage follows the first scan pattern and does not stop when moving along a scan line. Especially—the first mechanical stage does not stop when a suspected defect is imaged. The movement along the first scan line can be of a constant velocity but this is not necessarily so and this movement can include accelerations and decelerations which are usually moderate in relation to accelerations and decelerations introduced by a second mechanical stage.

The second mechanical stage may be a nano-stage or a micro-stage.

The second mechanical stage may use magnetic levitation (maglev, or magnetic suspension) thereby supporting the object (which is suspended) with no support other than magnetic fields. Wikipedia indicates that magnetic pressure is used to counteract the effects of the gravitational and any other accelerations.

The second mechanical stage may include a flexure bearing, may be a micro-stage that may include electrostatic comb-drive actuators such as illustrated in "Large range dual-axis micro-stage driven by electrostatic comb-drive actuators", Mohammad Olfatnia, Leqing Cui, Pankaj Chopra and Shorya Awtar, TOP PUBLISHING JOURNAL OF MICROMECHANICS AND MICROENGINEERING page 23 (2013) or in U.S. Pat. No. 6,806,991 titled "Fully released MEMs XYZ flexure stage with integrated capacitive feedback" all being incorporated herein by reference.

The first scan pattern may be determined regardless of the locations of the suspected defects. The first scan pattern may be determined in order to allow coverage of the entire wafer or a region of interest of the wafer.

The coverage may require that the entire wafer (or entire region of interest) can be viewed by optics even if the wafer is only moved by the first mechanical stage.

Alternatively the coverage may require that the entire wafer (or the entire region of interest) is viewed by the optics by combined movements of the first mechanical stage and the second mechanical stage.

Referring to FIG. 2, areas 501-508 illustrate the areas covered by the optics (aggregate fields of view of the optics) when the wafer is only moved according to the first scan pattern 40. These areas 501-508 are only portions of the wafer. The gaps between areas 501-508 are covered by additional movements introduced by the second mechanical stage—so that the entire wafer can be covered by movements introduced by the first mechanical stage and the second mechanical stage.

Figure 3:
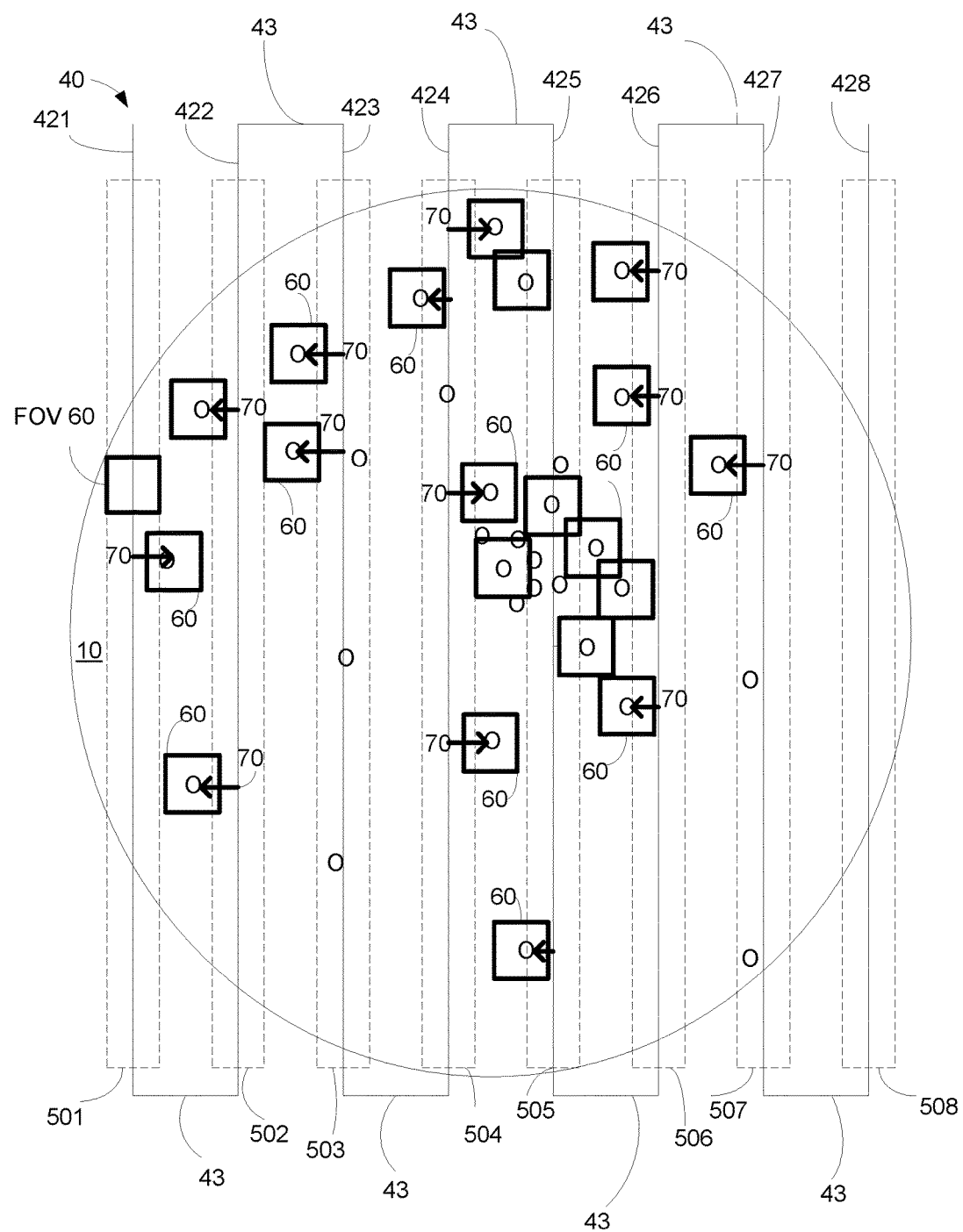
FIG. 3 illustrates a wafer, multiple suspected defects, fields of view, a first scan pattern, movements introduced by a second mechanical stage, and areas of the wafer viewed by optics when an object is moved by a first mechanical stage and by a second mechanical stage, according to an embodiment of the invention.

FIG. 3 illustrates a wafer 10, multiple suspected defects 20, fields of view 60, a first scan pattern 40, movements 70 introduced by a second mechanical stage, and areas 421-428 of the wafer viewed by optics when wafer 10 is moved by first and second mechanical stage according to an embodiment of the invention. FIG. 3 shows that suspected defects that are outside of areas 501-508 can be viewed by the optics (included in fields of view 60 of the optics) by introducing movements 70 by the second mechanical stage. FIG. 3 illustrates movements 70 as horizontal movements but these movements can be non-linear, circular, linear but not horizontal, and the like.

Figure 4:
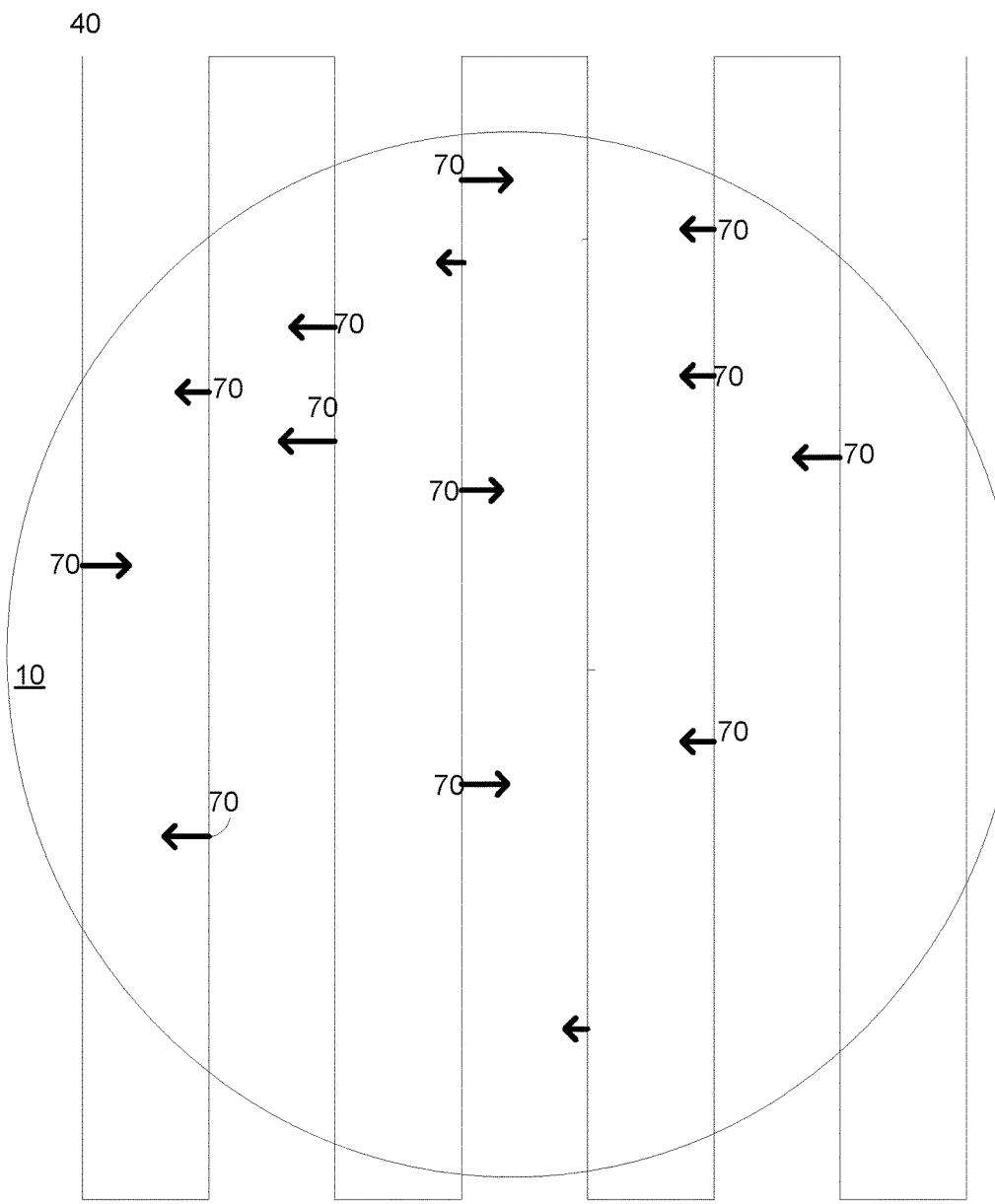
FIG. 4 illustrates a set of suspected defects, a portion of a first scan pattern, movements introduced by a second mechanical stage, fields of view that include the set of suspected defects and are associated with two different scan iterations, according to an embodiment of the invention.

FIG. 4 differs from FIG. 3 by illustrating movements 70, wafer 10 and first scan pattern 40 and not showing (for brevity of explanation) the suspected defects or fields of view that include these suspected defects. Movements 70 may be regarded as a second scan pattern followed by the second mechanical stage.

Figure 5:
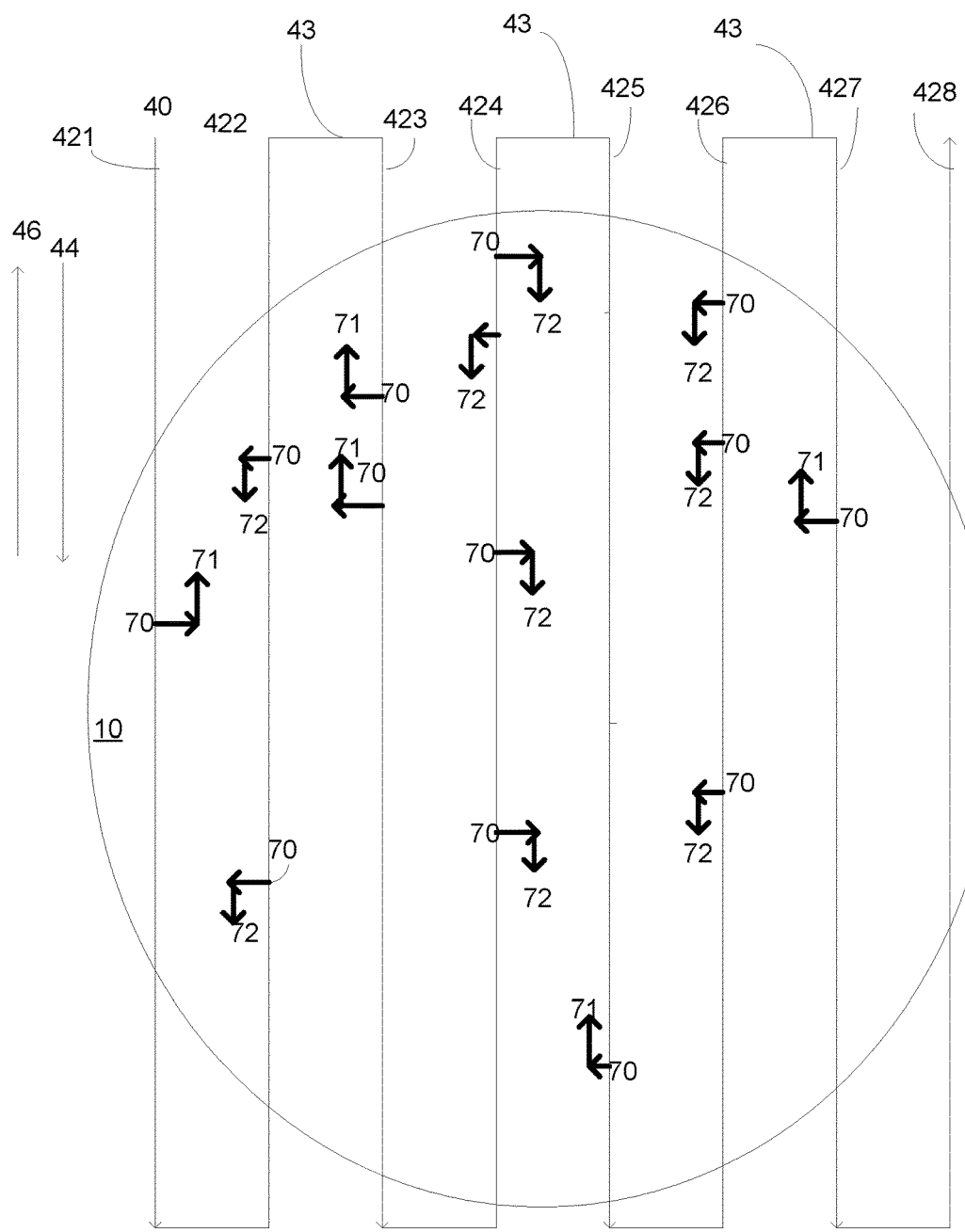
FIG. 5 illustrates a wafer, a first scan pattern and movements introduced by a second mechanical stage, according to an embodiment of the invention.

FIG. 5 illustrates wafer 10, first scan pattern 40, movements 70, counter movements 71 and counter movements 72 that are introduced by a second mechanical stage according to an embodiment of the invention. Counter movements 71 and counter movements 72 are opposite in direction to the direction of movement introduced by the first mechanical stage. Movements 70 are the same horizontal movements illustrated in FIGS. 2 and 3. Movements 70 allow the optics to view suspected defects that are located outside coverage areas (denoted 501-508 in FIG. 2) obtained when moving the wafer by the first mechanical stage alone.

Scan lines 411, 413, 425 and 455 represent downward movement 44 of the first mechanical stage. Counter movements 71 are associated with these scan lines are upward movements. Scan lines 412, 414, 426 and 458 represent upward movement 46 of the first mechanical stage. Counter movements 72 are associated with these scan lines are upward movements.

Figure 6:
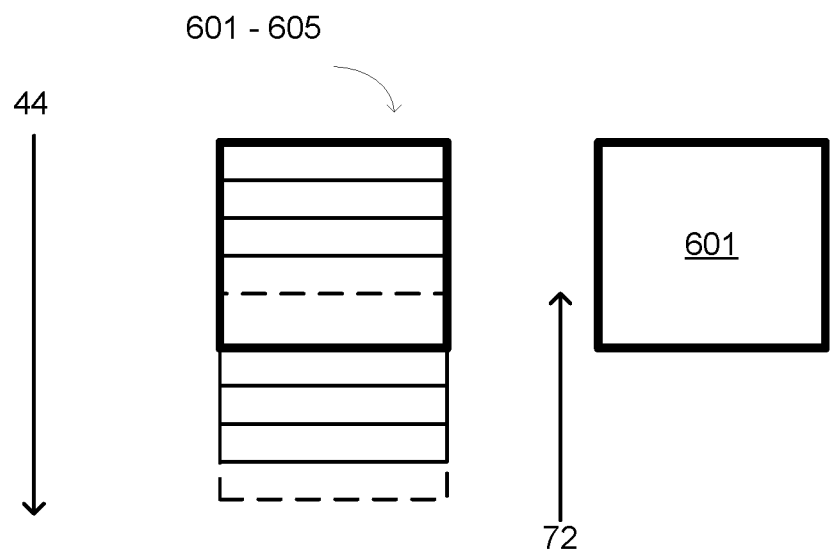
FIG. 6 illustrates a wafer, a first scan pattern and movements introduced by a second mechanical stage according to an embodiment of the invention.

FIG. 6 illustrates a freezing effect obtained by the counter movements. Without the counter movement the movement of the wafer by first mechanical stage 220 would result in multiple partially overlapping fields of view 601-605 while the counter movement virtually consolidates these fields of view to a single field of view 601.

It is noted that even when using a combination of movements by the first mechanical stage and the second mechanical stage, the acquisition of an image of each suspected defect requires a certain period. During this certain period the second mechanical stage may move towards a suspected defect, allow the acquisition of an image of the suspected defect and then move towards a next suspected defect. If the multiple suspected defects are proximate to each other than the imaging of the multiple suspected defects may require adopting a first scan pattern that includes a slower movement of the first mechanical stage or accelerations and/or decelerations of the first mechanical stage. Additionally or alternatively, instead of imaging all the multiple suspected defects in a single scan iteration—different suspected defects can be scanned during different scan iterations.

Figure 7:
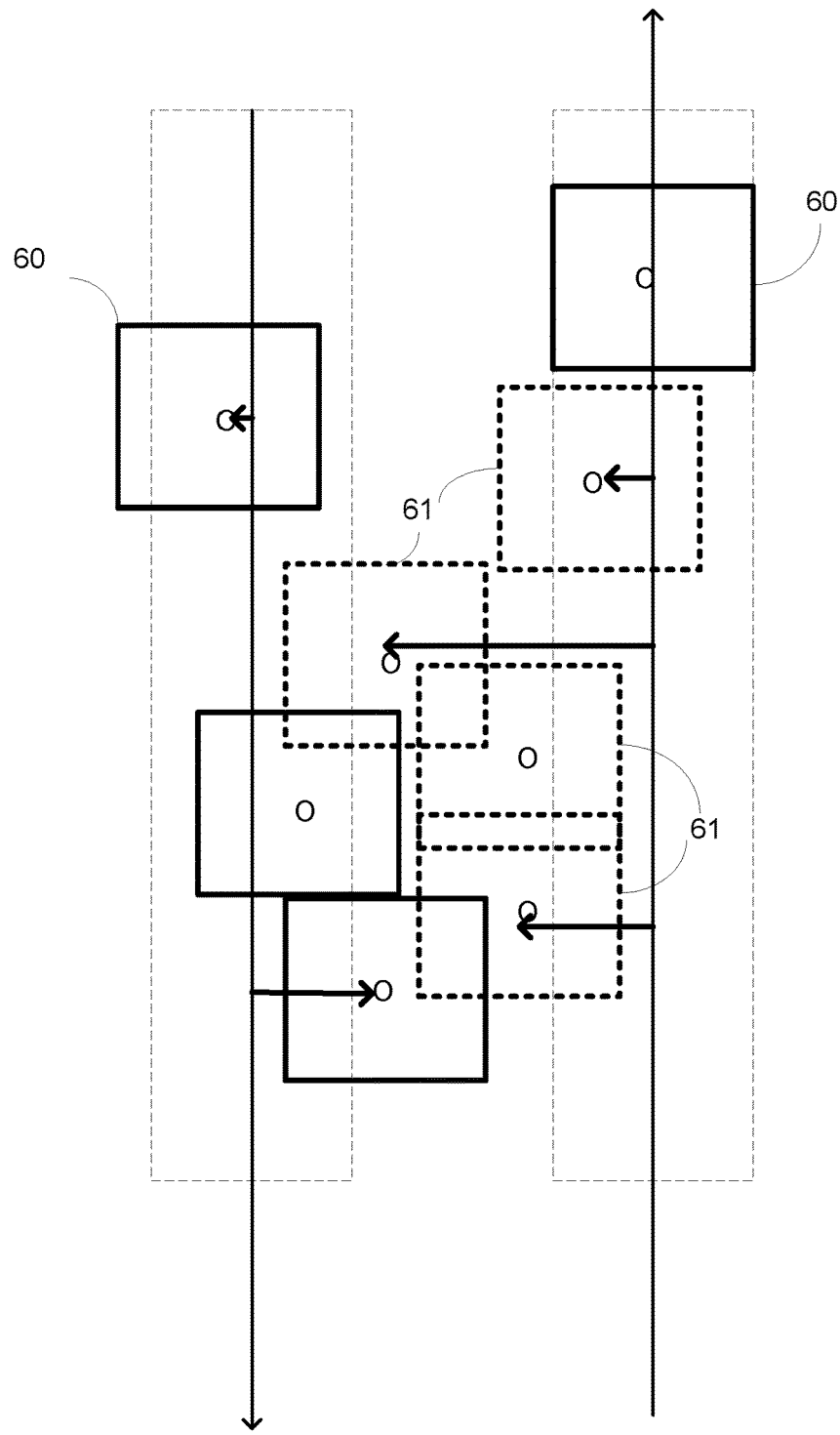
FIG. 7 illustrates partially overlapping fields of view and a single field of view obtained by counter movement introduced by the second mechanical stage, according to an embodiment of the invention.

FIG. 7 illustrates a first set of suspected defects (each suspected detect of the first set is surrounded by solid line field of view 60) that are imaged during a first scan iteration and a second set of defects (each suspected defect of the second set is surrounded by dashed line field of view 61) that are scanned during a second scan iteration. During each scan iteration the first mechanical stage follows a first scan pattern. The first scan pattern can be the same for all scan iterations but may differ from one scan iteration to the other.

A non-limiting example of various parameters of the first and second mechanical stage is provided below.

The first mechanical stage can be an X-Y stage that has a span of 300-450 millimeters in both X-axis and Y-axis.

The second mechanical stage can be an X-Y stage that has a span of 2-10 millimeters in both X-axis and Y-axis.

The second mechanical stage can have a move and settle duration that is below 30 milliseconds.

The second mechanical stage may have an accuracy of about 50 nanometers.

The second mechanical stage may have a motion profile should be smooth with no deviation in vertical direction greater than 1 micron.

The second mechanical stage motion profile may have no jitter in all degrees of freedom greater than 100 nanometers at frequencies below 50 Hz.

The second mechanical stage should convey a small load (for example—up to five kilograms).

The second mechanical stage may be equipped with a motion control sensor that can be a laser interferometer which detects the positioning by two mirrors in X and Y directions which are attached to a wafer chuck.

The second mechanical stage can be a flexture X-Y stage.

It is noted that each one of the first mechanical stages can also introduce Z-axis (vertical) movements or be coupled to a Z stage.

According to another embodiment of the invention the second mechanical stage can move along a single direction—for example the second mechanical stage can be an X-stage or a Y-stage.

According to an embodiment of the invention the first mechanical stage and the second mechanical stages are Z-stages. Yet according to another embodiment of the invention the first mechanical stage and the second mechanical stages are X-Z stages capable of moving along a Z axis and an X axis. Yet according to another embodiment of the invention the first mechanical stage and the second mechanical stages are Z-Y stages capable of moving along a Z axis and a Y axis. Yet according to another embodiment of the invention the first mechanical stage and the second mechanical stages are X-Y-Z stages.

According to an embodiment of the invention the first mechanical stage may perform rough height (Z axis) movements and the second mechanical stage can perform delicate and fast height (Z axis) movements.

Figure 8:
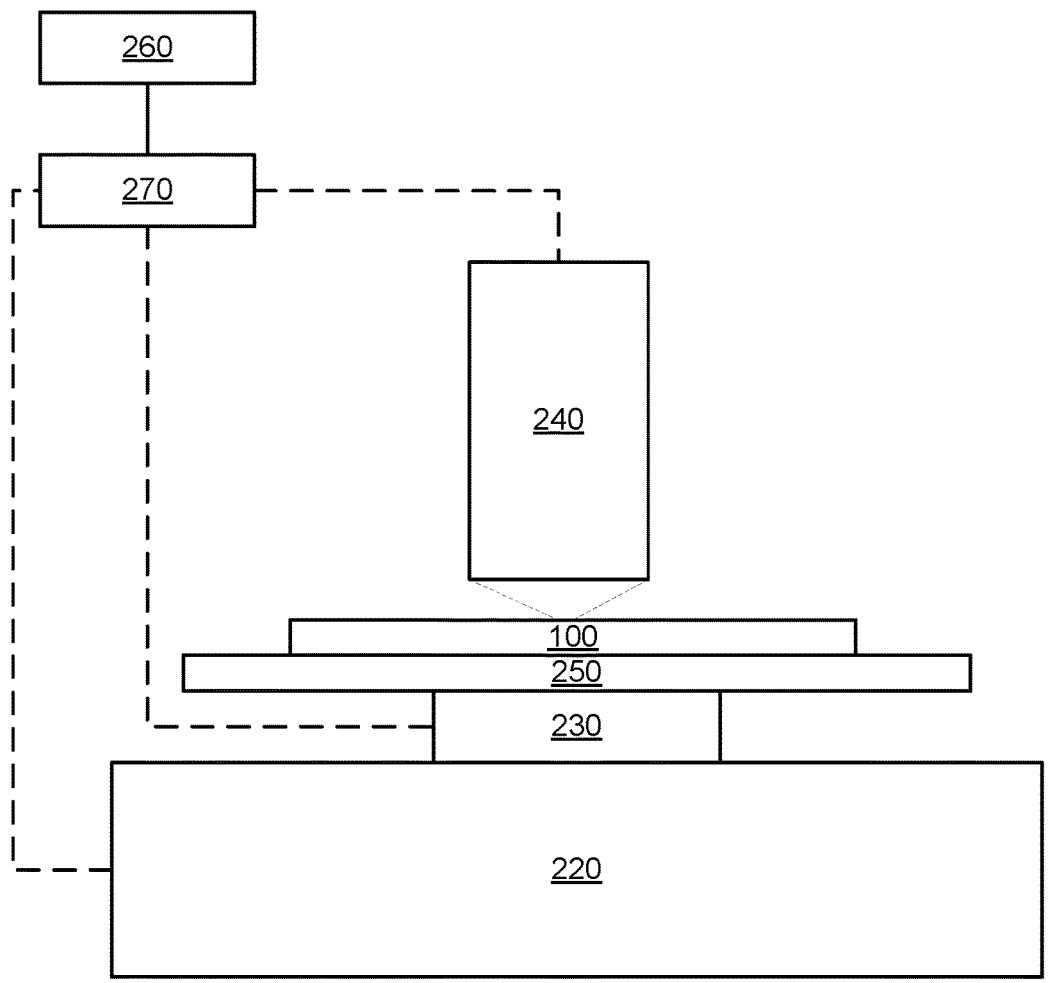
FIG. 8 illustrates a system according to an embodiment of the invention.

FIG. 8 illustrates system 200 and wafer 10 according to an embodiment of the invention. System 200 includes first mechanical stage 220, second mechanical stage 230, chuck 250, optics 240, interface 260 and controller 270. Optics 240 may include an illumination module for illuminating wafer 10, collection module for collecting radiation from wafer 10. Optics 240 may include lenses, deflectors, beam splitters, collimators, apertures, radiation sources and the like.

Interface 260 may receive the locations of the suspected defect. Additionally or alternatively interface 260 may receive information about the desired first scan pattern and desired movements of the second mechanical stage.

Controller 270 may receive the locations of the suspected defects, the information about the desired first scan pattern and desired movements of the second mechanical stage and control first mechanical stage 220 to follow the first scan pattern, control second mechanical stage 230 to perform the desired movements and control optics 240 to acquire images of multiple suspected defects.

Alternatively, controller 270 can receive the locations of the multiple suspected defects and determine the first scan pattern and the desired movements to be executed by second mechanical stage 230. The determining is followed by controlling first mechanical stage 220, second mechanical stage 230 and optics 240.

Figure 9:
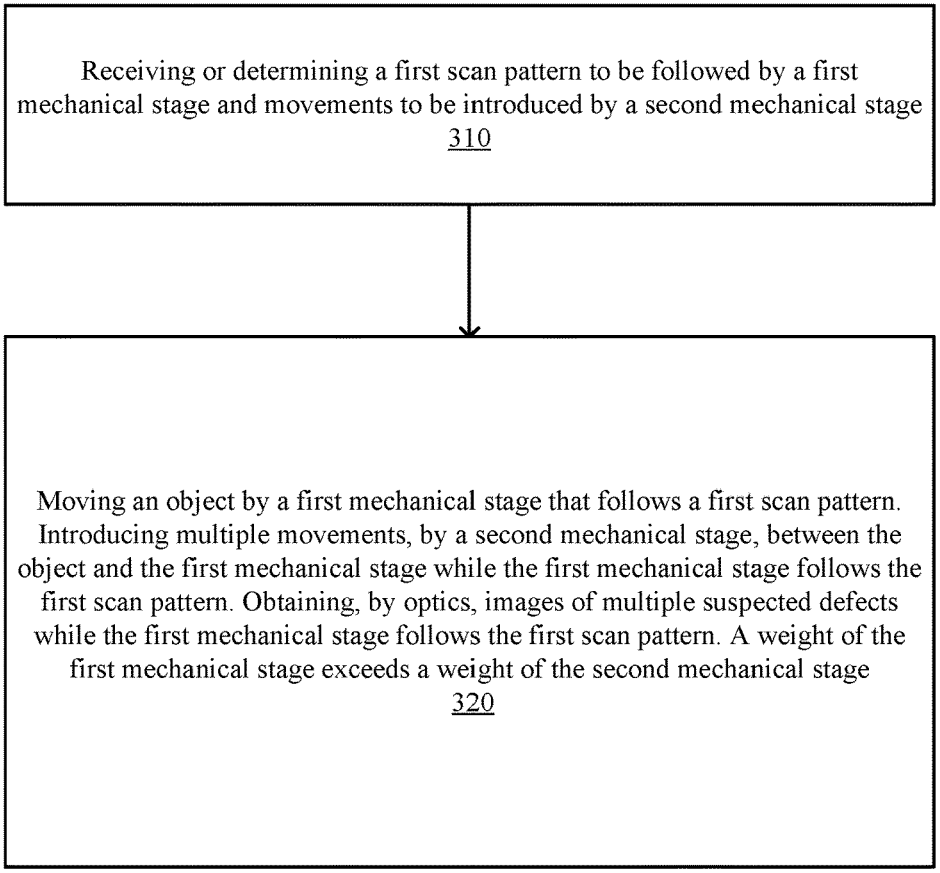
FIG. 9 illustrates a method according to an embodiment of the invention.

System 200 may be arranged to execute method 300 of FIG. 9. It is noted that system 200 may include one or more additional mechanical stages. For example—an additional mechanical stage can be placed between first mechanical stage 220 and second mechanical stage 230. Yet for another example—first mechanical stage 220 may support at least one more additional second stage.

First mechanical stage 220 is heavier, slower and of lower acceleration than the second mechanical stage 230. The second mechanical stage 230 can be used to perform relatively short but fast movements.

First mechanical stage 220 can move wafer 10 to be positioned so that optics 240 images a predefined location of wafer 10 and use the second mechanical stage 230 to acquire images of an area that is proximate to the predefined location.

An inspection system usually scans wafer 10 one slice after the other. A "change slice" operation for jumping from one slice to the other can utilize the fast movements of the second mechanical stage 230.

When first mechanical stage 220 accelerates the second mechanical stage 230 can counter the acceleration thereby enable image acquisition even during the acceleration of first mechanical stage 220.

System 200 may track first mechanical stage 220 and second mechanical stage 230 using a single control loop or may use a separate control loop for each one of first mechanical stage 220 and second mechanical stage 230.

System 200 may provide a large envelop movement performance for all related parameters as speed, acceleration, cover area, settling time.

FIG. 9 illustrates a method 300 according to an embodiment of the invention. Method 300 may start by step 310 of receiving or determining a first scan pattern to be followed by a first mechanical stage and movements to be introduced by a second mechanical stage. Step 310 may include at least one of the following:

a. Determining the first scan pattern in view of locations of the multiple suspected defects.
b. Determining the first scan pattern and a second scan pattern in view of (a) locations of the multiple suspected defects, and (b) allowable acceleration values associated with the first scan pattern and the second scan pattern. The second scan pattern is formed by the multiple movements introduced by the second mechanical stage.
c. Determining a second scan pattern in view of (a) an image obtaining period required for acquiring one or more images of a suspected defect, (b) a desired velocity of a movement of the first mechanical stage when scanning a scan line of the first scan pattern; (c) a time period required for the second mechanical stage to position a suspected defect within a field of view of the optics.
d. Determining a second scan pattern in view of (a) an image obtaining period required for acquiring one or more images of a suspected defect, (b) a desired velocity of a movement of the first mechanical stage when scanning a scan line of the first scan pattern; (c) a time period required for the second mechanical stage to position a suspected defect within a field of view of the optics. The second scan pattern is formed by the multiple movements introduced by the second mechanical stage.

e. Determining the first scan pattern and a second scan pattern in view of (a) an image obtaining period required for acquiring one or more images of a suspected defect, (b) a desired velocity of a movement of the first mechanical stage when scanning a scan line of the first scan pattern; (c) a time period required for the second mechanical stage to position a suspected defect within a field of view of the optics; wherein the second scan pattern is formed by the multiple movements introduced by the second mechanical stage Step 310 may be followed by step 320 of (a) moving an object by a first mechanical stage that follows a first scan pattern; (b) introducing multiple movements, by a second mechanical stage, between the object and the first mechanical stage while the first mechanical stage follows the first scan pattern; and (c) obtaining, by optics, images of multiple suspected defects while the first mechanical stage follows the first scan pattern. A weight of the first mechanical stage exceeds a weight of the second mechanical stage.

Step 320 may include at least one of the following:

a. Moving the object by the first mechanical stage thereby causing the object to move within a first plane that is not orthogonal to a direction of the movement introduced by the second mechanical stage. For example both first and second mechanical stages can be X-Y stages.

b. Moving of the object by the first mechanical stage comprises performing, by the first mechanical stage, movements along multiple scan lines (see, for example vertical scan lines 421-428 of FIGS. 2-4). The obtaining of the image of each one of the suspected defects is performed without altering a velocity of each one of the movements along the multiple scan lines.

c. Performing, by the first mechanical stage, movements along multiple scan lines (see, for example vertical scan lines 421-428 of FIGS. 2-4). The obtaining of the image of each one of the suspected defects is performed during the performing of the movements along the multiple scan lines. A highest acceleration introduced by the first mechanical stage during any of the movements along the multiple scan lines is lower than a highest acceleration introduced by the second mechanical stage during any of the multiple movements between the object and the first mechanical stage.

d. Performing, by the first mechanical stage, constant velocity movements along multiple scan lines. The obtaining of the image of each one of the suspected defects is performed without altering a velocity of each one of the constant velocity movements.

e. Introducing a movement out of the multiple movements by the second mechanical stage so that a field of view of the optics moves towards a suspected defect (see for example movements 70, counter movements 71 and counter movements 72 of FIG. 5, movements 70 of FIGS. 3-4) if it is determined that the suspected defect is outside a field of view of the optics in case that the object is moved only by the first mechanical stage that follows the first scan pattern (see, for example areas 501-508 of FIGS. 2-3).

f. Refraining from introducing a movement, by the second mechanical stage, so that a field of view of the optics moves towards a suspected defect if it is determined that the suspected defect is within a field of view of the optics in case that the object is moved only by the first mechanical stage that follows the first scan pattern.

g. Performing, by the first mechanical stage, movements along multiple scan lines; and introducing a counter movement (see, for example counter movements 71 and counter movements 72 of FIG. 5) by the second mechanical stage, while the first mechanical stage performs a movement along a scan line thereby increasing a period in which a suspected defect is within a field of view of the optics.

h. Moving of the second mechanical stage thereby moving the object.

Figure 10:
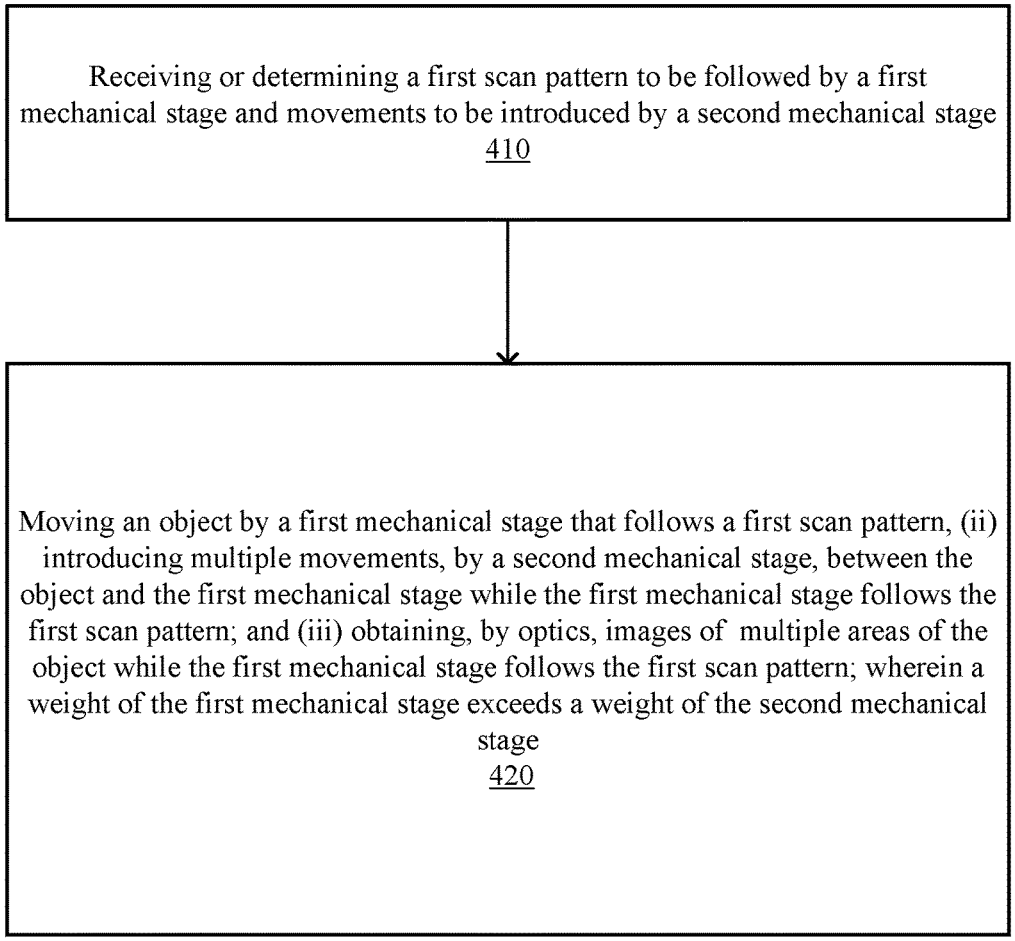
FIG. 10 illustrates a method according to an embodiment of the invention.

FIG. 10 illustrates method 400 according to an embodiment of the invention. Method 400 may start by step 410 of receiving or determining a first scan pattern to be followed by a first mechanical stage and movements to be introduced by a second mechanical stage. The first mechanical stage and the second mechanical stage may differ from each other by their properties and the combination of the first scan pattern and the movements introduced by the second mechanical stage can determine to obtain a desired scan speed, scan accuracy, scan accelerations, and the like.

Step 410 may be followed by step 420 of (i) moving an object by a first mechanical stage that follows a first scan pattern, (ii) introducing multiple movements, by a second mechanical stage, between the object and the first mechanical stage while the first mechanical stage follows the first scan pattern; and (iii) obtaining, by optics, images of multiple areas of the object while the first mechanical stage follows the first scan pattern; wherein a weight of the first mechanical stage exceeds a weight of the second mechanical stage. The multiple areas may cover the entire object or only a part of the object.

Step 420 may be executed during a defect review process and the multiple areas of the object may correspond to suspected defects of the object. Additionally or alternatively, step 420 may be executed by an inspection process, an electrical test process or any process that requires scanning multiple areas of an object. Accordingly, method 400 is not limited to defect review.

Furthermore—any reference to a defect review process should be applied mutatis mutandis to inspection processes or any other process that requires scanning multiple areas of an object.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system, comprising:
   a first mechanical stage configured to move an object in the X and Y directions by following a first scan pattern;
   a second mechanical stage configured to introduce multiple movements in the X and Y directions between the object and the first mechanical stage while the first mechanical stage follows the first scan pattern; and
   optics configured to obtain images of multiple suspected defects on the object while the first mechanical stage follows the first scan pattern;
   wherein a weight of the first mechanical stage exceeds a weight of the second mechanical stage.

2. The system according to claim 1 wherein first mechanical stage is configured to move the object within a first plane that is not orthogonal to a direction of the movement introduced by the second mechanical stage.

3. The system according to claim 1 wherein the second mechanical stage is configured to move the object in the X and Y directions within a first span of 2-10 millimeters and the first mechanical stage is configured to move the object in the X and Y directions within a second span that is at least an order of magnitude greater than the first span.

4. The system according to claim 3 wherein the second span is between 300-450 mm.

5. The system according to claim 1 wherein the first mechanical stage is heavier, slower and of lower acceleration than the second mechanical stage and the second mechanical stage is configured to perform relatively short but fast movements.

6. The system according to claim 1 further comprising a controller configured to execute instructions stored in a computer-readable memory that, once executed, cause the controller to control movement of the first and second mechanical stages and can control the second mechanical stage to introduce counter movements to the first mechanical stage to create a freeze effect on a field of view of the optics during an image capture event.

7. A system for scanning an object, the system comprising:
a first mechanical stage having a first weight and being configured to move an object in the X and Y directions;
a second mechanical stage having a second weight that is less than the first weight and being configured to introduce multiple movements in the X and Y directions between the object and the first mechanical stage;
optics configured to obtain images of multiple suspected defects on the object while the object is being moved by the first mechanical stage; and
a controller configured to execute instructions stored in a computer-readable memory that, once executed, cause the controller to: control the first mechanical stage to move an object on the first mechanical stage according to a first scan pattern; control the second mechanical stage to introduce multiple movements in the X and Y directions between the object and the first mechanical stage while the first mechanical stage is following the first scan pattern; and control the optics to obtain images of multiple suspected defects on the object while the first mechanical stage follows the first scan pattern.

8. A method for scanning an object, comprising:
moving an object by a first mechanical stage that follows a first scan pattern;
introducing multiple movements, by a second mechanical stage, between the object and the first mechanical stage while the first mechanical stage follows the first scan pattern; and
obtaining, by optics, images of multiple suspected defects while the first mechanical stage follows the first scan pattern;
wherein a weight of the first mechanical stage exceeds a weight of the second mechanical stage.

9. The method according to claim 8 wherein the moving of the object by the first mechanical stage causes the object to move within a first plane that is not orthogonal to a direction of the movement introduced by the second mechanical stage.

10. The method according to claim 8 wherein the moving of the object by the first mechanical stage comprises performing, by the first mechanical stage, movements along multiple scan lines; and wherein the obtaining of the images of the multiple suspected defects is performed without altering a velocity of each one of the movements along the multiple scan lines.

11. The method according to claim 8 wherein the moving of the object by the first mechanical stage comprises performing, by the first mechanical stage, movements along multiple scan lines; and wherein the obtaining of the images the multiple suspected defects is performed during the performing of the movements along the multiple scan lines; and wherein a highest acceleration introduced by the first mechanical stage during any of the movements along the multiple scan lines is lower than a highest acceleration introduced by the second mechanical stage during any of the multiple movements between the object and the first mechanical stage.

12. The method according to claim 8 wherein the moving of the object by the first mechanical stage comprises performing, by the first mechanical stage, constant velocity movements along multiple scan lines; and wherein the obtaining of the images the multiple suspected defects is performed without altering a velocity of each one of the constant velocity movements.

13. The method according to claim 8 comprising introducing a movement out of the multiple movements by the second mechanical stage so that a field of view of the optics moves towards a suspected defect if it is determined that the suspected defect is outside a field of view of the optics in case that the object is moved only by the first mechanical stage that follows the first scan pattern.

14. The method according to claim 8 comprising refraining from introducing a movement, by the second mechanical stage, so that a field of view of the optics moves towards a suspected defect if it is determined that the suspected defect is within a field of view of the optics in case that the object is moved only by the first mechanical stage that follows the first scan pattern.

15. The method according to claim 8 wherein the moving of the object by the first mechanical stage comprises performing, by the first mechanical stage, movements along multiple scan lines; and introducing a counter movement by the second mechanical stage, while the mechanical stage performs a movement along a scan line thereby increasing a period in which a suspected defect is within a field of view of the optics.

16. The method according to claim 8 comprising determining the first scan pattern in view of locations of the multiple suspected defects.

17. The method according to claim 8 comprising determining the first scan pattern and a second scan pattern in view of (a) locations of the multiple suspected defects, and (b) allowable acceleration values associated with the first and second scan patterns; wherein the second scan pattern is formed by the multiple movements introduced by the second mechanical stage.

18. The method according to claim 8 comprising determining a second scan pattern in view of (a) an image obtaining period required for acquiring one or more images of a suspected defect, (b) a desired velocity of a movement of the first mechanical stage when scanning a scan line of the first scan pattern; (c) a time period required for the second mechanical stage to position a suspected defect within a field of view of the optics.

19. The method according to claim 8 comprising determining a second scan pattern in view of (a) an image obtaining period required for acquiring one or more images of a suspected defect, (b) a desired velocity of a movement of the first mechanical stage when scanning a scan line of the first scan pattern; (c) a time period required for the second mechanical stage to position a suspected defect within a field of view of the optics; and wherein the second scan pattern is formed by the multiple movements introduced by the second mechanical stage.

20. The method according to claim 8 comprising determining the first scan pattern and a second scan pattern in view of (a) an image obtaining period required for acquiring one or more images of a suspected defect, (b) a desired velocity of a movement of the first mechanical stage when scanning a scan line of the first scan pattern; (c) a time period required for the second mechanical stage to position a suspected defect within a field of view of the optics; and wherein the second scan pattern is formed by the multiple movements introduced by the second mechanical stage.

* * * * *